United States Patent [19]

Fatula, Jr. et al.

[11] 4,407,058

[45] Oct. 4, 1983

[54] METHOD OF MAKING DENSE VERTICAL FET'S

[75] Inventors: Joseph J. Fatula, Jr., Poughkeepsie, N.Y.; Paul L. Garbarino, Ridgefield, Conn.; Joseph F. Shepard, Hopewell Junction, N.Y.

[73] Assignee: International Business Machines Corporation, Armonk, N.Y.

[21] Appl. No.: 266,231

[22] Filed: May 22, 1981

[51] Int. Cl.³ .................................... H01L 21/225
[52] U.S. Cl. .................................. 29/571; 29/578; 29/580; 29/591; 148/187; 148/188; 357/23
[58] Field of Search .............. 148/187, 188; 29/571, 29/578, 580, 591; 357/23 VD

[56] References Cited

U.S. PATENT DOCUMENTS

| | | | |
|---|---|---|---|
| 4,102,714 | 7/1978 | DeBar et al. | 29/571 |
| 4,105,475 | 8/1978 | Jenne | 148/175 |
| 4,194,283 | 3/1980 | Hoffman | 29/571 |
| 4,200,968 | 5/1980 | Schroeder | 29/571 |
| 4,264,382 | 4/1981 | Anantha et al. | 29/576 W |
| 4,272,302 | 6/1981 | Jhabvala | 29/571 X |
| 4,326,332 | 4/1982 | Kenney | 29/571 |
| 4,327,476 | 5/1982 | Iwai et al. | 29/580 X |
| 4,356,211 | 10/1982 | Riseman | 29/576 W |
| 4,369,564 | 1/1983 | Hiltpold | 29/580 X |

Primary Examiner—G. Ozaki
Attorney, Agent, or Firm—Frank C. Leach, Jr.; George O. Saile

[57] ABSTRACT

A dielectrically isolated region of a monocrystalline substrate, which has a <100> orientation, has a drain region of a field effect transistor (FET) in a surface having a (100) crystal orientation with the drain region being of opposite conductivity to the conductivity of the substrate. A gate channel extends into the substrate from the drain region and is surrounded at its upper end by the drain region. An enlarged recess extends into the substrate beneath the gate channel and has its walls of opposite conductivity to the conductivity of the substrate to form a source region and a plate of a capacitor when the FET is part of a storage cell. The source region has its upper end surrounded by the gate channel.

9 Claims, 27 Drawing Figures

METHOD OF MAKING DENSE VERTICAL FET'S

CROSS REFERENCE TO RELATED PATENT APPLICATION

The copending patent application of Joseph J. Fatula et al for "FET Memory Cell Structure And Process," Ser. No. 165,592, filed July 3, 1980, and assigned to the same assignee as the assignee of this application is incorporated by reference.

TECHNICAL FIELD

This invention relates to a dense vertical field effect transistor (FET) and a method for making and, more particularly, to a high density memory cell of an FET and a method of making.

BACKGROUND ART

In U.S. Pat. No. 4,105,475 to Jenne, there is shown a semiconductor device having an array of single transistor VMOS memory cells. Each of the cells includes a storage capacitor region in a substrate with a V-shaped recess extending thereinto and having the oxide of a gate element on its walls. A drain region of each of the memory cells is in surrounding relation to the V-shaped recess and closer to the upper end of the channel region of the gate element than the lower end.

One problem with the VMOS memory cell of the aforesaid Jenne patent is that it requires a buried storage capacitor if the semiconductor device is to have a relatively high density of the VMOS memory cells thereon. However, this requires an additional processing step.

Another problem with the VMOS memory cell of the aforesaid Jenne patent is that the gate oxide has a tendency to break down at the bottom of the V-shaped recess when subjected to a relatively low voltage. This point breakdown of the gate oxide causes the storage cell to cease to function properly.

A further problem with the VMOS memory cell of the aforesaid Jenne patent is that it depends upon an outdiffusion during growth of an epitaxial layer to control the threshold voltage between the gate channel region and the substrate. Thus, it is a requisite of the VMOS memory cell of the aforesaid Jenne patent that the substrate include an epitaxial layer.

The present invention overcomes the foregoing problems of the aforesaid Jenne patent in that there is no requirement for any buried storage capacitor. There also is no point formed for the gate oxide so that the point breakdown of the gate oxide is eliminated. The present invention also does not require the growth of an epitaxial layer to control the threshold voltage since it utilizes an ion implantation to control the threshold voltage. It is not possible to implant ions in a VMOS memory cell at the time that such is required to control the threshold voltage.

Additionally, the present invention also has a substantially higher density of memory cells in comparison with the density of the VMOS memory cells.

One means of increasing the charge storage region of a memory cell is through forming an enlarged wall in the substrate and is shown in the aforesaid Fatula et al application. In the aforesaid Fatula et al application, the drain and source regions are formed in the surface of the substrate with the charge storage region being beneath the drain region.

The present invention is an improvement of the aforesaid Fatula et al application in that only one of the drain and source regions is formed in the surface of the substrate. Thus, the density of the memory cells of the present invntion can be increased beyond the memory cell density of the structure of the aforesaid Fatula et al application.

SUMMARY OF THE INVENTION

The dense vertical FET device of the present invention reduces the area required for each device through having only one of the drain and source regions of the FET formed in the surface of the substrate. The other of the source and drain regions of the FET is formed in the substrate beneath the one region of the FET in the surface of the substrate. Thus, a relatively small surface area on the substrate is required for each of the FETs.

An object of this invention is to provide a method of forming a dense vertical FET device.

Another object of this invention is to provide a dense vertical FET device.

A further object of this invention is to provide a method for forming a high density memory cell.

Still another object of this invention is to provide a high density memory cell.

The foregoing and other objects, features, and advantages of the invention will be more apparent from the following more particular description of the preferred embodiments of the invention as illustrated in the accompanying drawings.

DETAILED DESCRIPTION OF PREFERRED EMBODIMENTS

Figure 1:
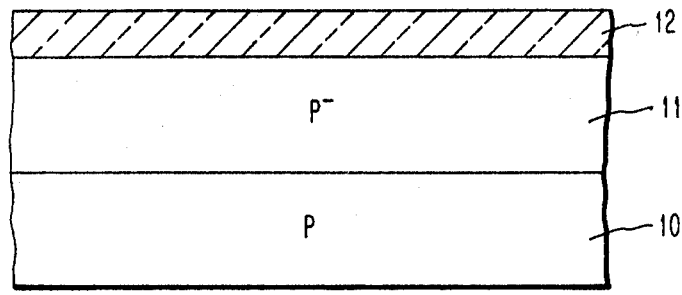
FIGS. 1-12 are fragmentary diagrammatic sectional views of a portion of a substrate showing various stages of formation of a dense vertical FET device in the substrate.

Referring to the drawings and particularly FIG. 1, there is shown a substrate 10 of monocrystalline silicon having a <100> orientation. The substrate 10 may be either P or P+ conductivity with the substrate 10 preferably being of P conductivity.

An epitaxial layer 11 is grown from the substrate 10 by any conventional techniques. The epitaxial layer 11 has a P conductivity when the substrate 10 has a P+ conductivity and has a P− conductivity when the substrate 10 has a P conductivity.

One suitable example of growing the epitaxial layer 11 is to use a mixture of $SiCl_4$—$H_2$ or $SiH_4$—$H_2$ at a temperature of about 1,000° C., for example. The epitaxial layer 11 may have a thickness in the range of two to six microns and preferably has a thickness in the range of three to four microns. The epitaxial layer 11 has a maximum impurity concentration or doping level of about $10^{15}$ atoms/cm$^3$.

After the epitaxial layer 11 has been grown, a layer 12 of silicon dioxide is formed on top of the epitaxial layer 11. The layer 12 of silicon dioxide may be formed through oxidizing a portion of the epitaxial layer 11, for example. When the layer 12 of silicon dioxide is formed through oxidizing a portion of the epitaxial layer 11, a portion of the epitaxial layer 11 must remain so that it still has a thickness of at least 700 Å to 2,000 Å after oxidation.

This thermal oxidation may occur in either dry oxygen or steam at a temperature in the range of 800° C. to 1,050° C., for example. When using steam, a temperature of 925° C. is preferred.

Instead of growing the layer 12 of silicon dioxide on the epitaxial layer 11, the layer 12 of silicon dioxide may be deposited by chemical vapor deposition (CVD). The thickness of the layer 12 of silicon dioxide is in the range of 1,000 Å to 5,000 Å and is preferably about 2,000 Å.

Figure 2:
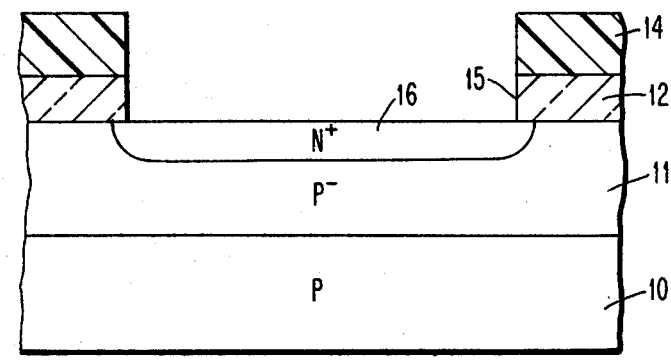

After the layer 12 of silicon dioxide is formed, a mask is placed over the layer 12 of silicon dioxide. The mask is formed by depositing a blanket layer 14 (see FIG. 2) of photoresist and then exposing and developing the layer 14 of photoresist to produce portions of the layer 14 of photoresist as shown in FIG. 2.

The remaining portions of the layer 14 of photoresist function as a mask to enable etching of openings 15 (see FIG. 2) in the layer 12 of silicon dioxide. This etching of the layer 12 of silicon dioxide to form the openings 15 therein may be by buffered hydrofluoric acid solution, which may be a 7:1 solution, for example, or by reactive ion etching (RIE) using a gas of $CF_4$—$H_2$, for example.

An N+ region 16 is then formed in the epitaxial layer 11 through each of the openings 15 in the layer 12 of silicon dioxide. The N+ region 16 is formed by diffusion or ion implantation. The diffused impurity may be phosphorous or arsenic.

One suitable example of forming the N+ region 16 in the epitaxial layer 11 is by ion implantation of arsenic ions having a concentration or dose of about $5\times10^{15}$ atoms/cm$^2$ and at an energy of 70 KeV. Thus, a plurality of the N+ regions 16 is formed in the epitaxial layer 11 at desired locations in accordance with the openings 15 in the layer 12 of silicon dioxide.

Figure 3:
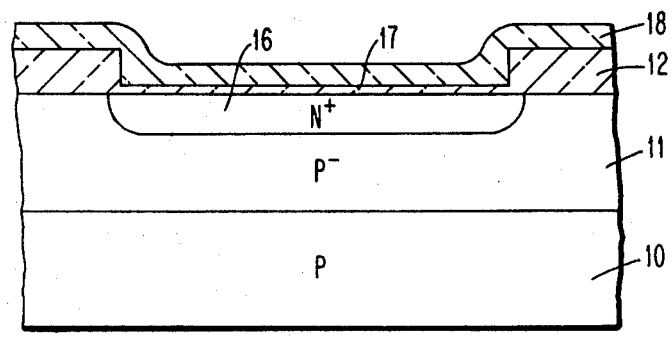

After the N+ regions 16 have been formed in the epitaxial layer 11 of the substrate 10, the remaining portions of the layer 14 of photoresist are stripped by a solvent and an acid or oxygen plasma and an acid, for example. Then, a very thin layer 17 (see FIG. 3) of silicon dioxide is formed over each of the N+ regions 16. The layer 17 of silicon dioxide is preferably formed by thermal oxidation with the same conditions as the layer 12 of silicon dioxide was thermally grown. The layer 17 of silicon dioxide has a thickness of 400 Å.

After the layer 17 of silicon dioxide is formed over each of N+ regions 16, a layer 18 of silicon nitride is deposited over the layer 17 of silicon dioxide and the layer 12 of silicon dioxide. The layer 18 of silicon nitride is preferably deposited as a conforming coating by low pressure chemical vapor deposition (LPCVD) and preferably has a thickness of 1,000 Å.

Figure 4:
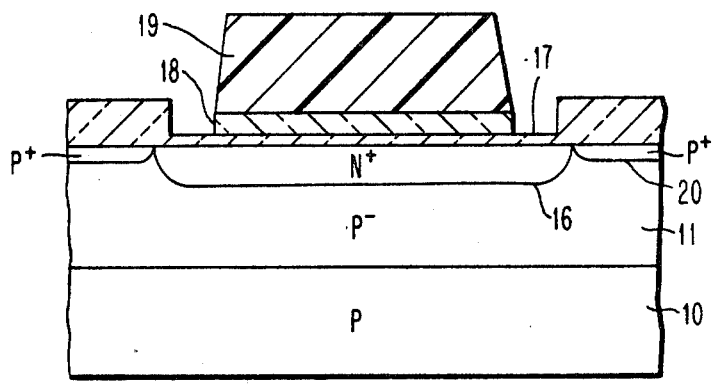

After the layer 18 of silicon nitride is deposited, a mask is placed over the layer 18 of silicon nitride. The mask is formed by depositing a blanket layer 19 (see FIG. 4) of photoresist and then exposing and developing the layer 19 of photoresist to produce portions of the layer 19 of photoresist as shown in FIG. 4.

The remaining portions of the layer 19 of photoresist function as the mask to enable etching of the layer 18 of silicon nitride to remove portions of the layer 18 of silicon nitride not protected by the remaining portions 19 of photoresist. This etching of the layer 18 of silicon nitride may be by a plasma gas of $CF_4$—$O_2$ or RIE with a gas of $CF_4$—$H_2$, for example.

After the layer 18 of silicon nitride has been etched to leave only the portions of the layer 18 of silicon nitride beneath the remaining portions of the layer 19 of photoresist, the remaining portions of the layer 19 of photoresist are stripped by a solvent and an acid or oxygen plasma and an acid, for example. Thus, the remaining portions of the layer 18 of silicon nitride overlie most but not all of each of the N+ regions 16.

There is an ion implantation of boron ions into the epitaxial layer 11 in all of the areas not having one of the N+ regions 16. These implanted boron ions form a channel stopper, which is a P+ region 20, in the epitaxial layer 11. One suitable example of implanting boron ions is to implant boron ions having a concentration of $6\times10^{12}$ atoms/cm$^2$ and at an energy of 80 KeV.

The boron ion implantation can occur before or after etching of the layer 18 of silicon nitride. When the boron ion implantation occurs after etching of the layer 18 of silicon nitride, it can occur before or after stripping of the layer 19 of photoresist. When the remaining portions of the layer 19 of photoresist are stripped before the ion implantation, there is reoxidation over each of the N+ regions 16 in the areas not protected by the remaining portions of the layer 18 of silicon nitride if the exposed portions of the layer 17 of silicon dioxide do not have a thickness of at least 200 Å. Then, the ions are implanted through the layer 17 of silicon dioxide or the newly grown thin layer of silicon dioxide having a thickness of at least 200 Å with a blanket implantation.

It is preferred that ion implantation occur after etching of the layer 18 of silicon nitride and before removal of the remaining portions of the layer 19 of photoresist.

Next, recessed isolation oxide (ROX) regions 22 (see FIG. 5) are formed by thermal oxidation, preferably in the presence of steam at a temperature of about 925° C. The ROX regions 22 have a thickness of about 4,000 Å to 6,000 Å. This results in spaced portions of each of the N+ regions 16 being surrounded by the ROX regions 22 because of the presence of the layer 18 of silicon nitride over most but not all of each spaced portion of each of the N+ regions 16.

Figure 5:
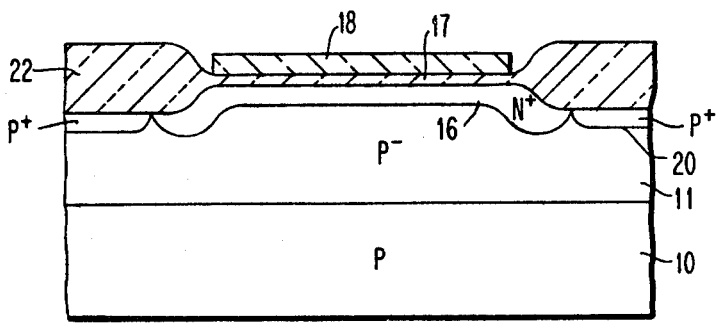

The cross sectional shape of each of the N+ regions 16 changes, as shown in FIG. 5, during formation of the ROX regions 22 because of the impurities of the dopant, which forms the N+ regions 16, moving downwardly into the epitaxial layer 11. Although the cross section of each of the N+ regions 16 is slightly bent at its periphery by the thermal growth of the ROX regions 22, it is still disposed in the (100) plane.

After the ROX regions 22 have been formed, the remaining portions of the layer 18 of silicon nitride are removed. The remaining portions of the layer 18 of silicon nitride are preferably removed by etching in a hot phosphoric acid ($H_3PO_4$) for ninety minutes at a temperature of about 165° C., for example.

Figure 6:
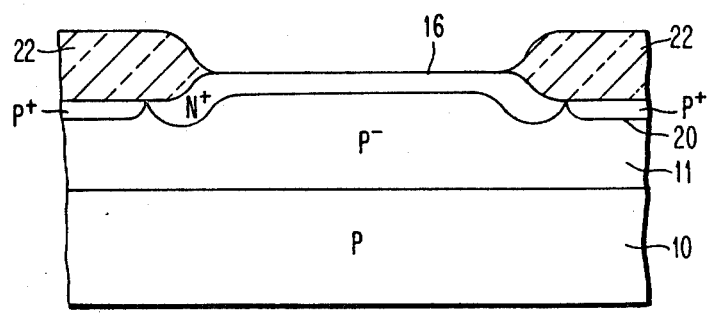

Then, the substrate 10 is dip etched in a buffered hydrofluoric acid solution, which may be 7:1 solution, for example, to remove the very thin layer 17 of silicon dioxide over each of the N+ regions 16. This produces the structure shown in FIG. 6.

Next, a recess 33 (see FIG. 7) is formed through each of the spaced portions of the N+ regions 16 and into the epitaxial layer 11. The recess 23 has its side walls 24 (two shown in FIG. 7) converging from its upper end at the top surface of the N+ region 16 to a bottom wall 25, which is along a (100) plane. The side walls 24 of the recess 23 form a substantially V-shaped relation through being along the (111) plane in the epitaxial layer 11.

This directional etching of each of the spaced portions of each of the N+ regions 16 and the underlying epitaxial layer 11 is produced by etching with a suitable anisotropic etchant, which is an etchant that etches in a direction along the (111) planes and is preferably a pyrocatechol-ethylene diamine solution. As the concentration of the epitaxial layer 11 increases towards the interface of the epitaxial layer 11 with the substrate 10, this increased concentration of the dopant causes the etch rate to decrease. Thus, etching may be easily stopped with the bottom wall 25 of the recess 23 within the epitaxial layer 11. When the conductivity of th epitaxial layer 11 is P— because the substrate 10 has a P conductivity, the etching must be more closely monitored to stop etching at the desired time so that there is no penetration of the recess 23 into the substrate 10.

Therefore, each of the recesses 23 is surrounded by the spaced portion of the N+ regions 16 through which it is formed. The upper end of each of the side walls 24 of the recess 23 terminates at the top surface of the spaced portion of the N+ region 16.

A protective layer of material is then formed over the side walls 24 of the recess 23. The protective layer of material includes a layer 26 (see FIG. 8) of silicon dioxide, which is formed on the bottom wall 25 of the recess 23, the side walls 24 of the recess 23, and the portions of the top surface of the spaced portion of the N+ region 16 not covered by the ROX regions 22. The layer 26 of silicon dioxide is preferably thermally grown.

The thickness of portions 27 of the layer 26 of silicon dioxide along the side walls 24 of each of the recesses 23 below the side walls 24 of each of the recesses 23 below the spaced portion of the N+ region 16 is about 1.2 times the thickness of portion 28 of the layer 26 of silicon dioxide along the bottom wall 25 of each of the recesses 23. The thickness of portion 29 of the layer 26 of silicon dioxide on each of the side walls 24 along the spaced portion of the N+ region 16 is in a range of 1.4 to 2 times the thickness of the portion 28 of the layer 26 of silicon dioxide over the bottom wall 25 of each of the recesses 23. Thus, if the portion 28 of the layer 26 of silicon dioxide has a thicknes of 400 Å along the bottom wall 25 of the recess 23, then the thickness of the portion 27 along each of the side walls 24 beneath each of the spaced portions of each of the N+ regions 16 would be 500 Å while the thickness of the portion 29 along each of the side walls 24 opposite each of the spaced portions of each of the N+ regions 16 would be in a range of 560 Å to 800 Å.

The temperature at which the thermal oxidation occurs is selected to maximize this relationship of the thicknesses of various portions of the layer 26 of silicon dioxide. As the temperature increases, the thicknesses of the portions 27-29 of the layer 26 of silicon dioxide would tend to become more equal. Accordingly, when thermally growing the layer 26 of silicon dioxide in steam, the temperature is in the range of 800° C. to 925° C.

After the layer 26 of silicon dioxide is formed, a layer 30 of silicon nitride is deposited as a conformal coating by LPCVD in the same manner as the layer 18 of silicon nitride was deposited. The thickness of the layer 30 of silicon nitride is preferably 1,000 Å.

After deposit of the layer 30 of silicon nitride, a layer 31 of silicon dioxide is deposited over the layer 30 of silicon nitride. The layer 31 of silicon dioxide is preferably deposited by LPCVD with a thickness of one micron.

Figure 9:
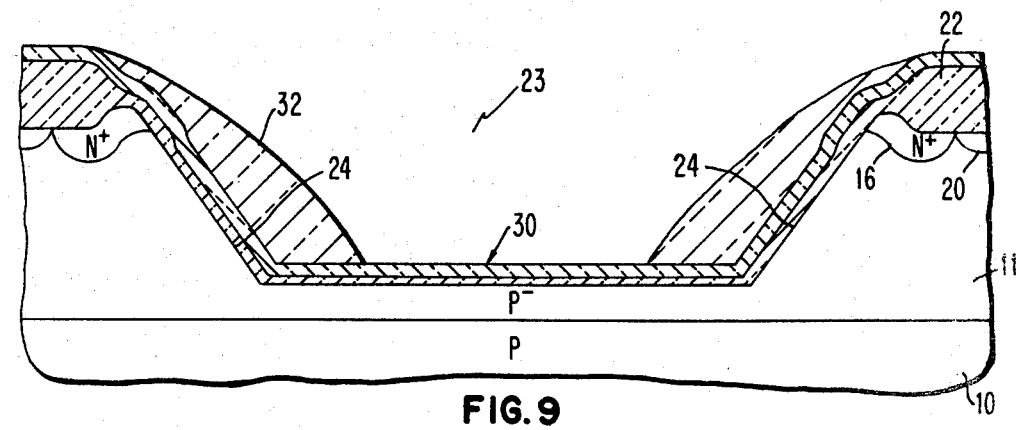

The layer 31 of silicon dioxide is subjected to RIE by a suitable gas such as $CF_4$—$H_2$, for example. This removes the layer 31 of silicon dioxide except for a portion 32 of silicon dioxide as shown in FIG. 9.

Figure 10:
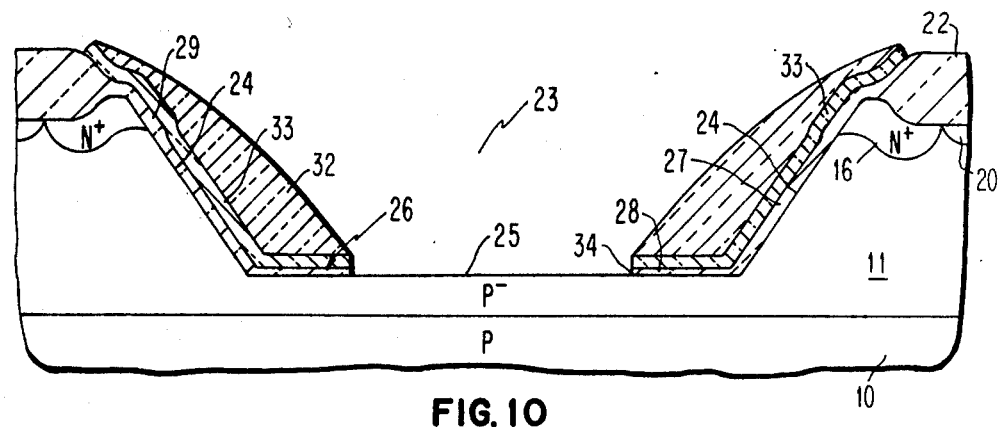

The portion 32 of silicon dioxide functions as a mask during RIE of the layer 30 of silicon nitride. RIE of the layer 30 of silicon nitride will leave a portion 33 of silicon nitride beneath the portion 32 of silicon dioxide as shown in FIG. 10. Suitable gases for RIE of the layer 30 (see FIG. 8) of silicon nitride include $CF_4$—$O_2$, $CCl_2$—$F_2$, and $SF_6$—$Cl_2$.

After the layer 30 of silicon nitride has been subjected to RIE to leave the portion 33 (see FIG. 10) of silicon nitride beneath the portion 32 of silicon dioxide, the layer 26 of silicon dioxide is subjected to RIE with the same gas as was used in RIE of the layer 31 (see FIG. 8) of silicon dioxide. As a result of the RIE of the layer 26 (see FIG. 10) of silicon dioxide, an opening 34 is formed in each of the bottom portions 28 of the layer 26 of silicon dioxide to provide access to the bottom wall 25 of each of the recesses 23.

Thus, the remaining portion of the layer 26 of silicon dioxide, the portion 33 of silicon nitride, and the portion 32 of silicon dioxide form a protective layer of material over the side walls 24 of each of the recesses 23. This protective layer of material extends above the top surface of the N+ region 16.

Figure 11:
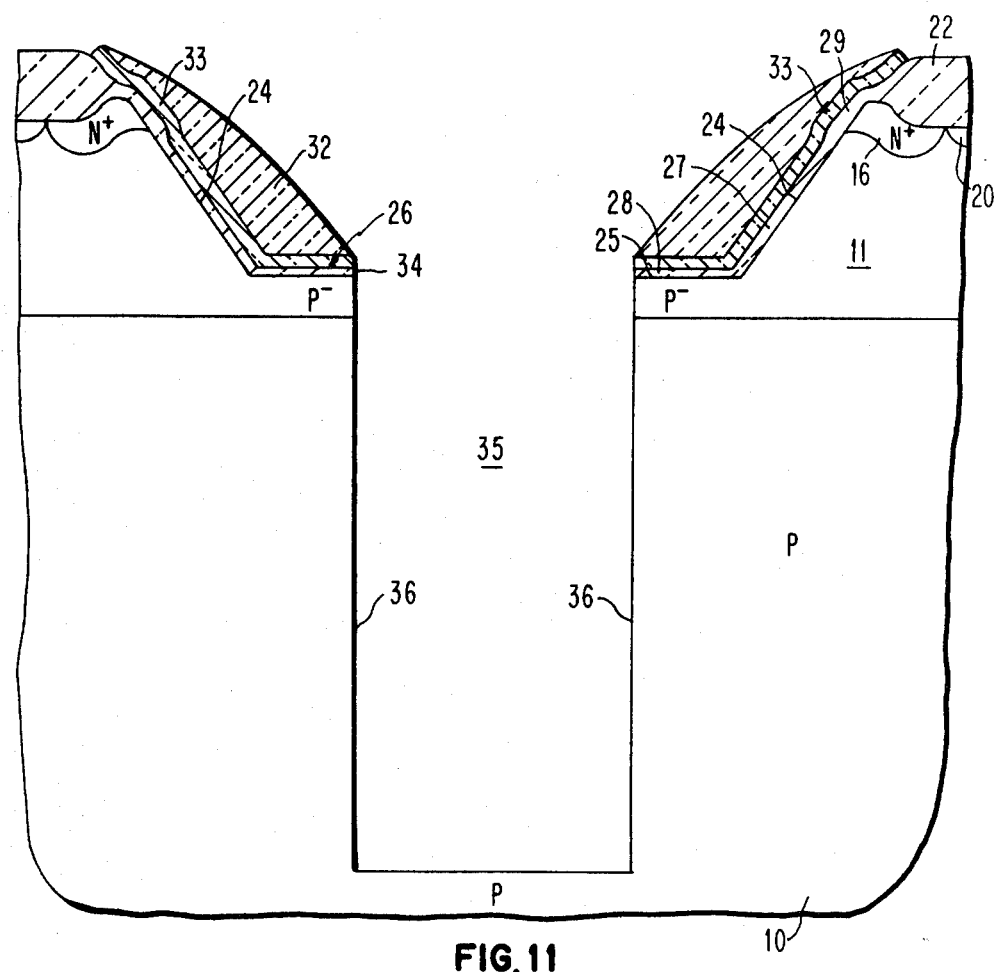

A trench or recess 35 (see FIG. 11) is formed through each of the openings 34 through the epitaxial layer 11 and into the substrate 10 for a selected distance. When the opening 34 in each of the bottom portions 28 of the layer 26 of silicon dioxide is square with each side being two microns, the maximum depth of the trench or recess 35 is 8.7 microns.

The trench or recess 35 is preferably formed by RIE. Any of the gases employed in RIE of the layer 30 (see FIG. 9) of silicon nitride may be employed to form the trench or recess 35 (see FIG. 11).

While the trench or recess 35 is preferably formed by RIE, it should be understood that the trench or recess 35 could be formed with a suitable plasma and would have side walls 36 (two shown in FIG. 11) substantially vertical. This is a directional plasma capable of etching substantially vertical side walls.

Figure 7:
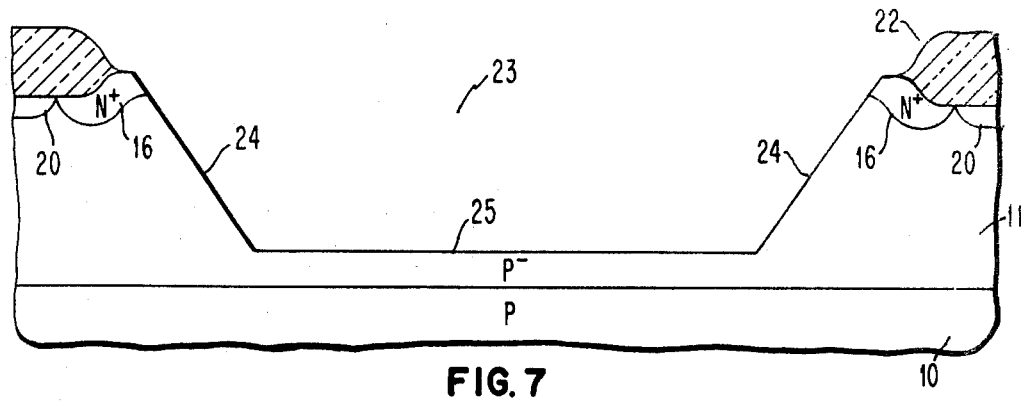
Figure 12:
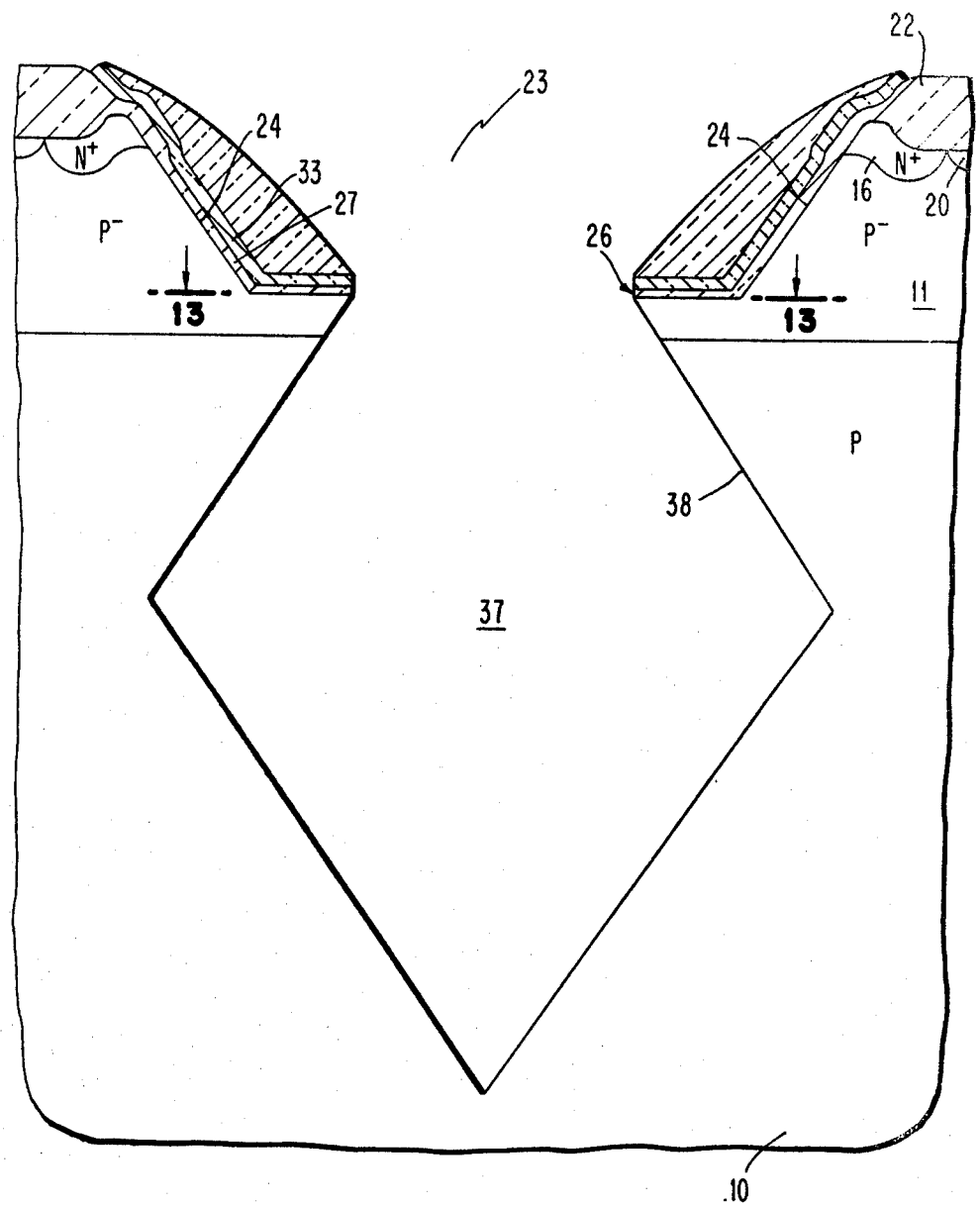

After the trench or recess 35 has been formed through the epitaxial layer 11 and into the substrate 10 for the selected distance, the side walls 36, which are in the (110) plane, of the trench or recess 35 are subjected to chemical etching by an anisotropic etchant in the same manner and with the same etchant as used to form each of the recesses 23 (see FIG. 7). This produces an enlarged recess 37 (see FIG. 12) having its side walls 38 diverge from their upper ends downwardly for a predetermined distance and then converge towards each other for a predetermined distance.

Figure 13:
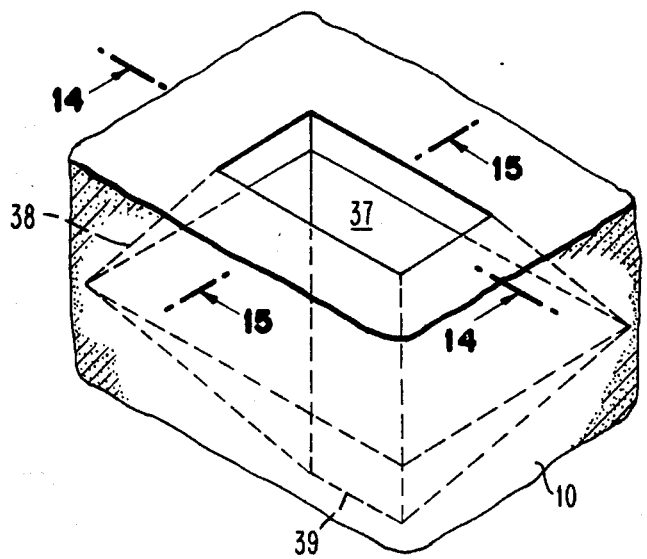
FIG. 13 is a fragmentary perspective view of a portion of the substrate showing a stage in forming the dense vertical FET device and taken along line 13—13 of FIG. 12.
Figure 14:
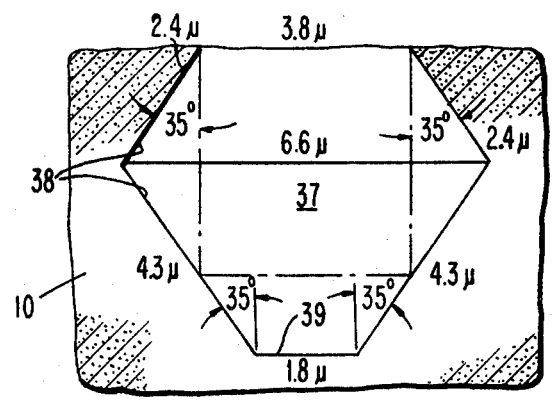
FIG. 14 is a fragmentary sectional view of the portion of the substrate of FIG. 13 and taken along line 14—14 of FIG. 13.
Figure 15:
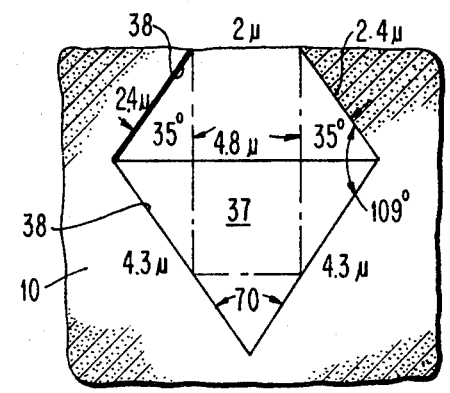
FIG. 15 is a fragmentary sectional view of the portion of the substrate of FIG. 13 and taken along line 15—15 of FIG. 13.
Figure 16:
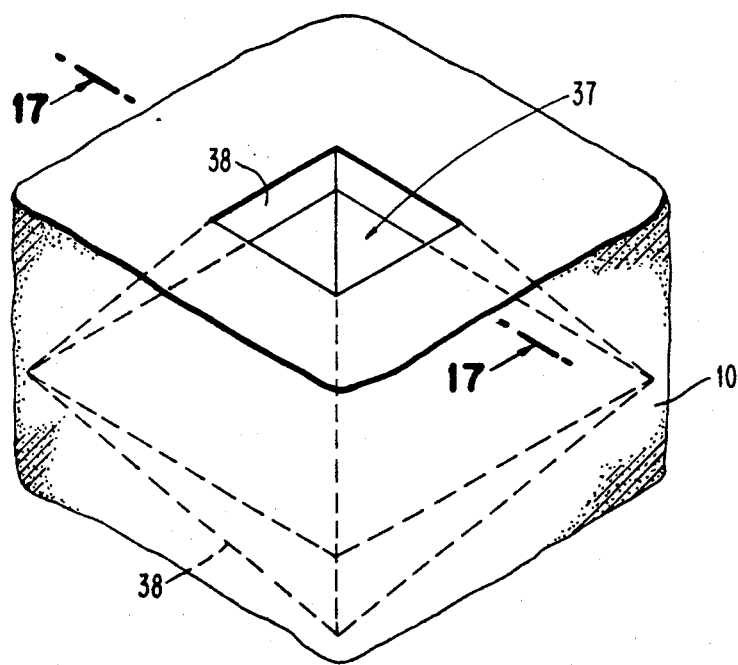
FIG. 16 is a fragmentary perspective view of a portion of the substrate showing a stage in forming the dense vertical FET device and taken along line 13—13 of FIG. 12.
Figure 17:
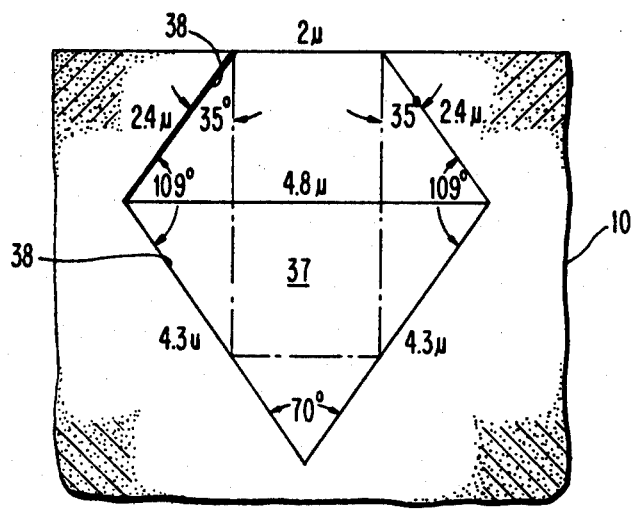
FIG. 17 is a fragmentary sectional view of the portion of the substrate of FIG. 16 and taken along line 17—17 of FIG. 16.

If the opening 34 (see FIG. 11) in each of the bottom portions 28 of the layer of silicon doxide is square so that the top of the recess 37 is square as shown in FIG. 16, the converging side walls 38 engage each other at their bottoms as shown in FIG. 17. However, if the opening 34 (see FIG. 11) in each of the bottom portions 38 of the layer 26 of silicon dioxide is rectangular with one of the sides being two microns and the other 3.8 microns, for example, so that the top of the recess 37 is rectangular as shown in FIG. 13, then the recess 37 has the configuration shown in FIG. 14 in one direction and the configuration of FIG. 15 orthogonal thereto. In the direction of FIG. 14, the side walls 38 along the longer dimension of the rectangular opening 34 (see FIG. 11) cannot converge to a point but are spaced from each other, intersecting along a line 39 (see FIG. 14) of the enlarged recess 37. This is because of the etching along the (111) planes. Thus, each of the recesses 37 may be deemed to be formed of a portion of each of two (upper and lower) four-sided pyramids.

Figure 18:
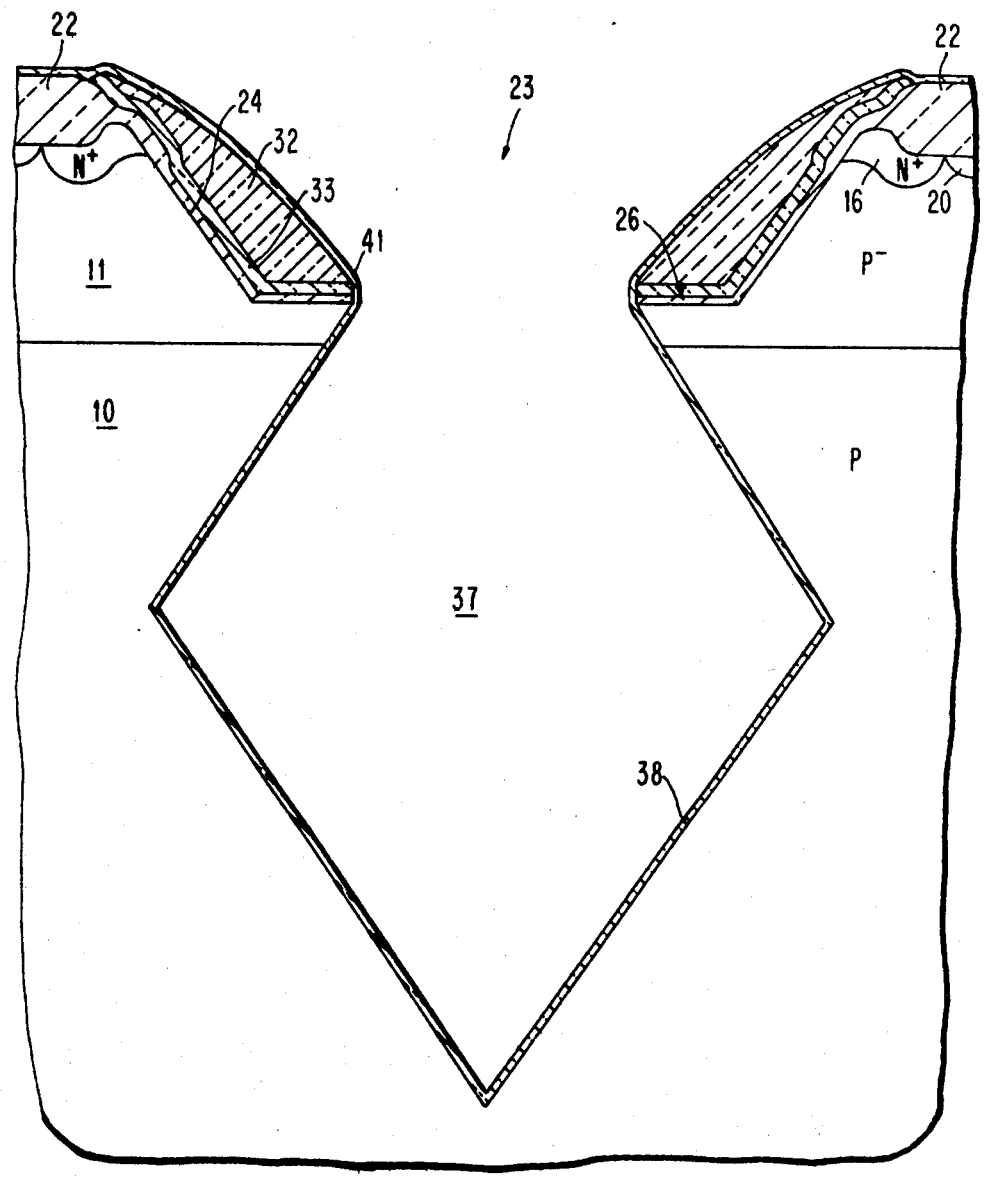
FIGS. 18 and 19 are fragmentary diagrammatic sectional views of a portion of the substrate showing further stages of formation of the dense vertical FET device in the substrate.
Figure 19:
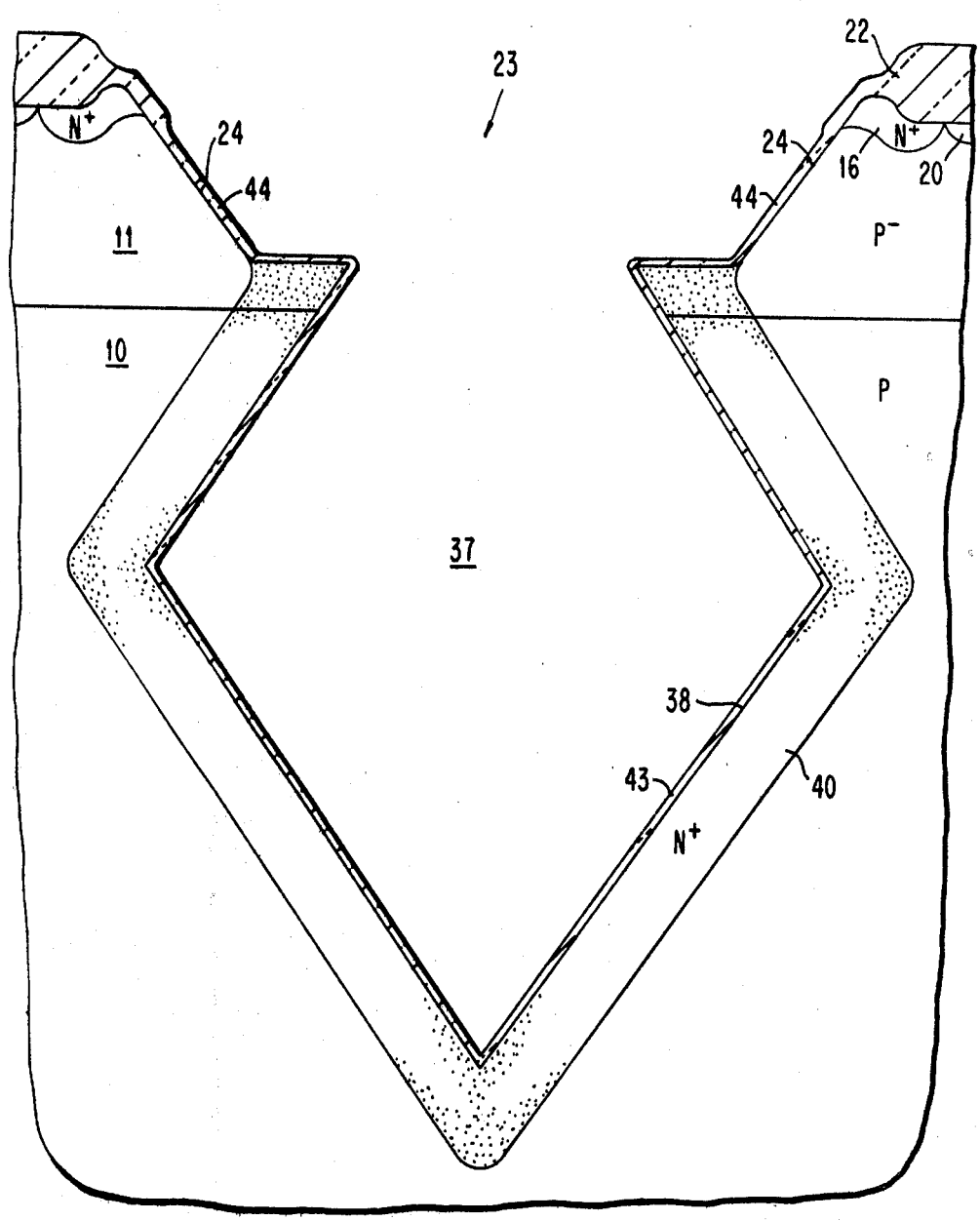

After formation of the enlarged recesses 37, an N+ region 40 (see FIG. 19) is formed exterior of the side walls 38 of each of the recesses 37 by a suitable diffusion. One means of diffusing an impurity into the side walls 38 of each of the recesses 37 to form each of the N+ regions 40 is to deposit a layer 41 (see FIG. 18) of phosphosilicate glass. The layer 41 of phosphosilicate glass is grown by passing POCl$_3$ and oxygen over the entire substrate 10 in a furnace at a temperature of 870° C.

After the layer 41 of phosphosilicate glass has been deposited on the entire substrate 10, the phosphorus from the layer 41 of phosphosilicate glass is driven into the portions of the epitaxial layer 11 and the substrate 10 in contact with the layer 41 of phosphosilicate glass and not protected by either silicon nitride or silicon dioxide. The phosphorus is driven out of the layer 41 of phosphosilicate glass at a temperature of 925° C. for fifteen to thirty minutes to produce each of the N+ regions 40 (see FIG. 19). The length of time is determined by the desired thickness of each of the N+ regions 40 with the thickness preferably being about 0.25 micron.

After each of the N+ regions 40 have been formed, the layer 41 (see FIG. 18) of phosphosilicate glass is stripped through dip etching with a buffered hydrofluoric acid solution, which may be a 7:1 solution, for example. The buffered hydrofluoric acid solution etches the layer 41 of phosphosilicate glass faster than it etches silicon dioxide. However, this dip etch also etches the portion 32 of silicon dioxide on top of the portion 33 of silicon nitride in each of the recesses 23.

Then, the portion 33 of silicon nitride in each of the recesses 23 is removed by wet etching. This is accomplished by etching the portion 33 of silicon nitride in a hot phosphoric acid at a temperature of 165° C., for example.

Next, the remaining portions of the layer 26 of silicon dioxide are removed. The remaining portions of the layer 26 of silicon dioxide are removed by a wet etch in a buffered hydrofluoric acid solution, which may be a 7:1 solution, for example.

Then, a layer 43 (see FIG. 19) of silicon dioxide is formed over the N+ region 40 and the side walls 24 of each of the recesses 23 including the end of the spaced portion of the N+ region 16. The layer 43 of silicon dioxide has a thickness in the range of 225 Å to 800 Å depending on the desired threshold voltage of the gate voltage.

The layer 43 of silicon dioxide is preferably thermally grown. The layer 43 of silicon dioxide may be grown in steam at a temperature of 800° C. or dry oxygen at 925° C.

Thus, the layer 43 of silicon dioxide has its portion 44 over the side walls 24 of each of the recesses 23 functioning as a gate oxide since a portion of the epitaxial layer 11 between the spaced portion of the N+ region 16 and the upper end of the N+ region 40 is a gate channel. Therefore, the spaced portion of the N+ region 16 is a drain region while the N+ region 40 is a source region as well as a plate of a capacitor with the substrate 10 being the other plate of the capacitor.

After the layer 43 of silicon dioxide is formed, a mask is placed over the layer 43 of silicon dioxide. The mask is formed by depositing a blanket layer of photoresist and then exposing and developing the layer of photoresist to produce openings in the layer of photoresist.

Figure 22:
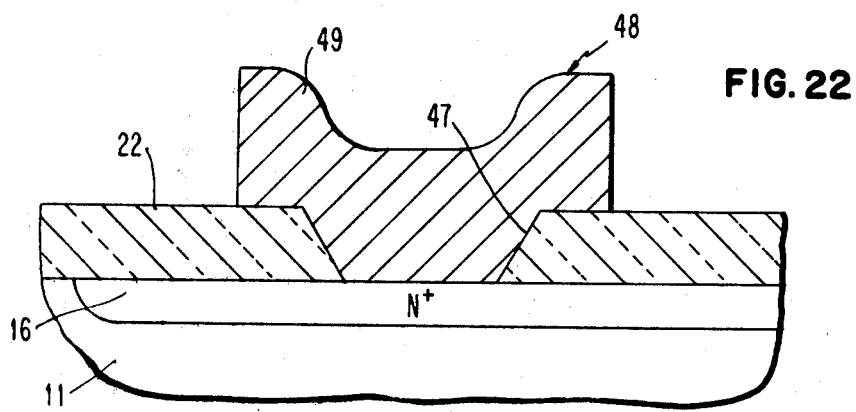
FIG. 22 is a fragmentary diagrammatic sectional view of a portion of the substrate showing the same stage of formation of the dense vertical FET device as FIG. 20 and taken along line 22—22 of FIG. 21.

The remaining portions of the layer of photoresist function as a mask to enable etching of contact holes 47 (see FIG. 22) in the ROX regions 22 through the openings in the layer of photoresist. This etching may be either by a buffered hydrofluoric acid solution, which may be a 7:1 solution, for example, or RIE with CF$_4$—H$_2$ gas, for example.

It should be understood that there is only one of the contact holes 47 formed in the ROX regions 22 for each of the N+ regions 16, which are separated from each other by the channel stoppers 20. This is because each of the N+ regions 16, which function as bit lines and extend in one direction substantially parallel to each other, will have only a single contact with a conductive line 48 (see FIG. 21).

Then, the remaining portions of the layer of photoresist are stripped by a solvent and an acid or oxygen plasma and an acid, for example. After the remaining portions of the layer of photoresist have been stripped, a suitable conductive material such as aluminum, tungsten silicide, or polycrystalline silicide, for example, is deposited as a blanket coating over the substrate 10.

Figure 20:
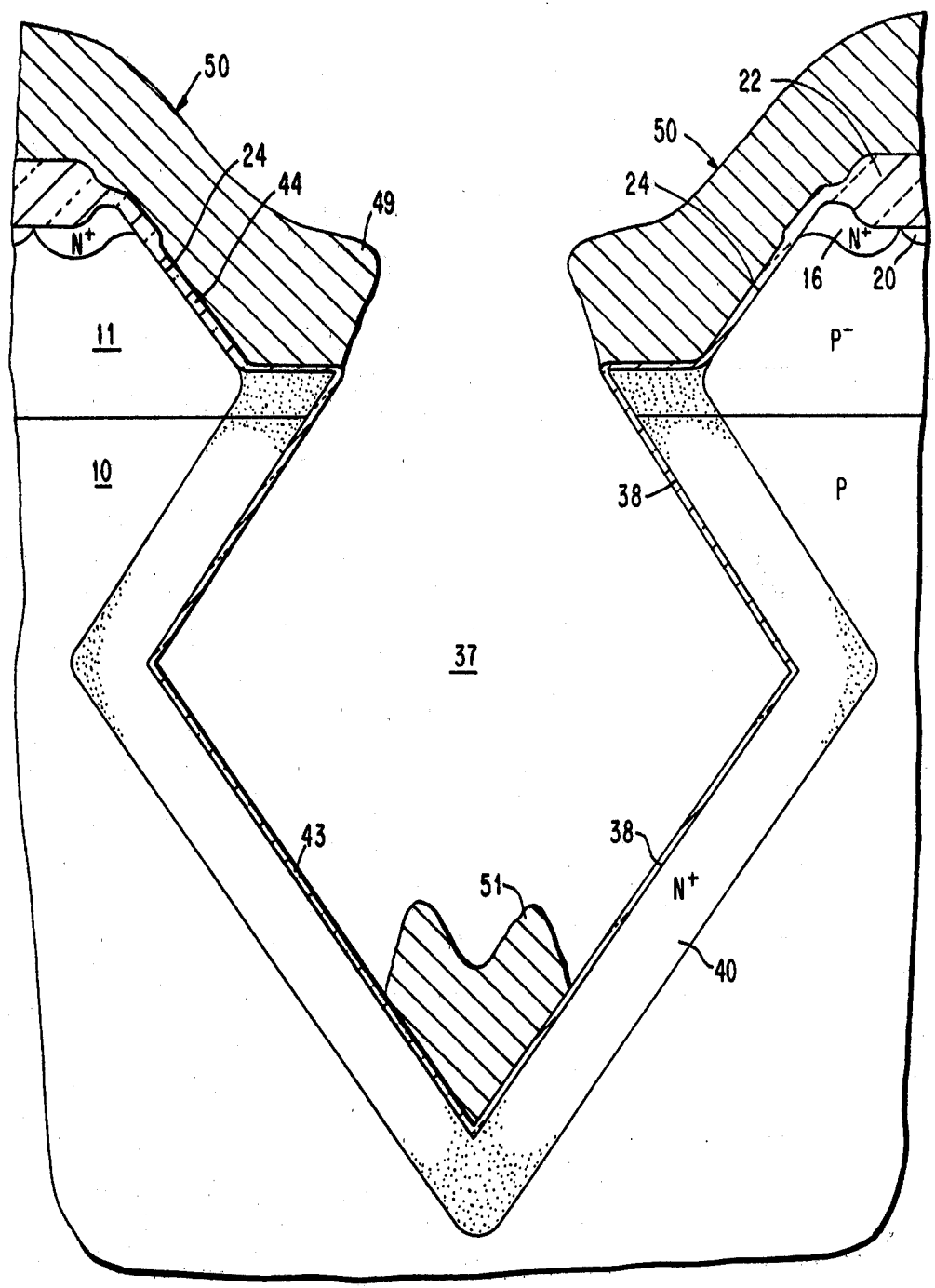
FIG. 20 is a fragmentary diagrammatic sectional view of a portion of the substrate showing another stage of formation of the dense vertical FET device and taken along line 20—20 of FIG. 21.
Figure 21:
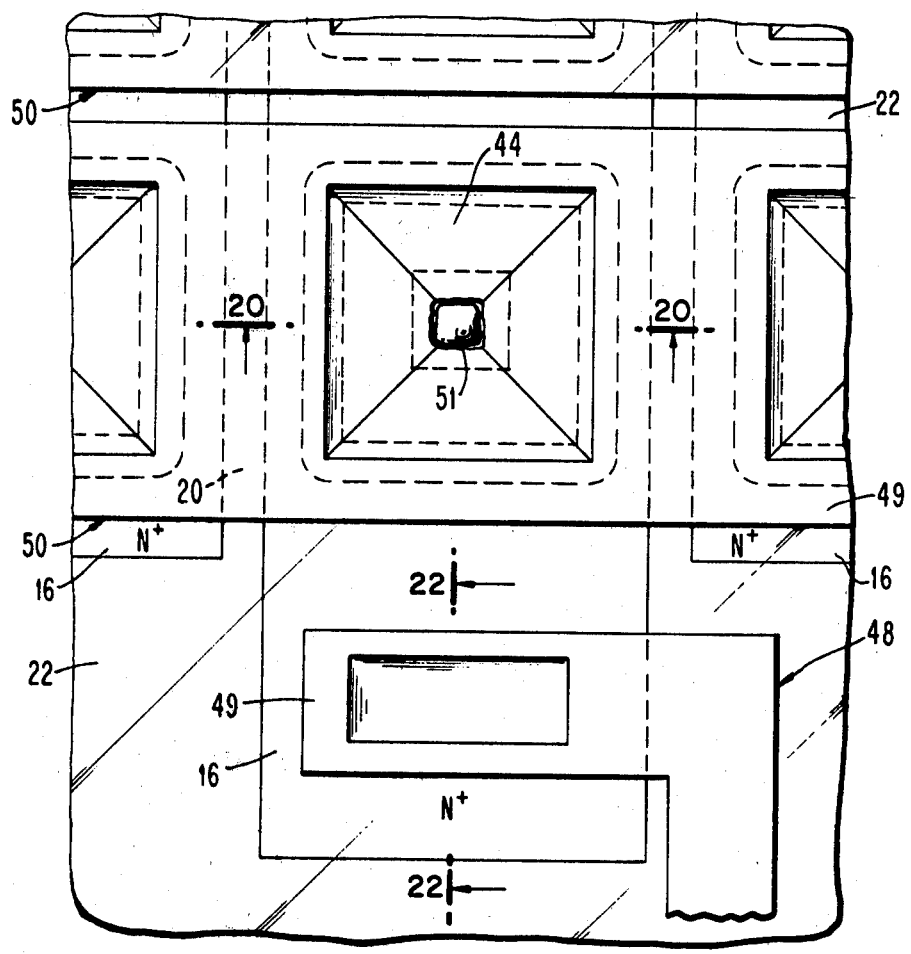
FIG. 21 is a fragmentary top plan view of a portion of a substrate in which dense vertical FET devices are formed and at the stage of formation shown in FIG. 20.

As an example, a layer 49 (see FIG. 20) of aluminum is deposited as a blanket coating over the substrate 10. Thus, the layer 49 of aluminum extends through the contact hole 47 (see FIG. 22) to have electrical contact with the N+ region 16 exterior of the storage cells as shown in FIG. 21.

After the layer 49 (see FIG. 20) of aluminum has been deposited as a blanket coating over the substrate 10, it is necessary to etch the layer 49 of aluminum to form the cnductive lines 48 (see FIG. 21) and conductive word lines 50. Each of the word lines has an electrical contact with the gate channel of each of the FETs in a row extending orthogonal to a row of the FETs having the N+ region 16 connected to one of the conductive lines 48.

The layer 49 (see FIG. 20) of aluminum may be etched by any well-known method. For example, the layer 49 of aluminum may be etched by subtractive etching or using a lift-off mask. In subtractive etching, a mask, which may be formed by the well-known photoresist technique, is placed over the layer 49 of aluminum. Then, a suitable etchant is employed to etch the aluminum through the openings in the mask to form the conductive lines 48 (see FIG. 21) and the word lines 50.

In using a lift-off mask, a mask is put down before the layer 49 (see FIG. 20) of aluminum is deposited. The mask may be formed by the well-known photoresist technique with openings being formed in the mask wherever the conductive lines 48 (see FIG. 21) or the word lines 50 are to be formed. Then, the mask is lifted off with the portions of the layer 49 (see FIG. 20) of aluminum that are to be removed.

When the layer 49 of aluminum is deposited, the portions of the layer 49 of aluminum above the recesses 37 fall to the bottom of the recess 37. Thus, as shown in FIG. 20, a portion 51 of aluminum is in the bottom of the recess 37.

Figure 23:
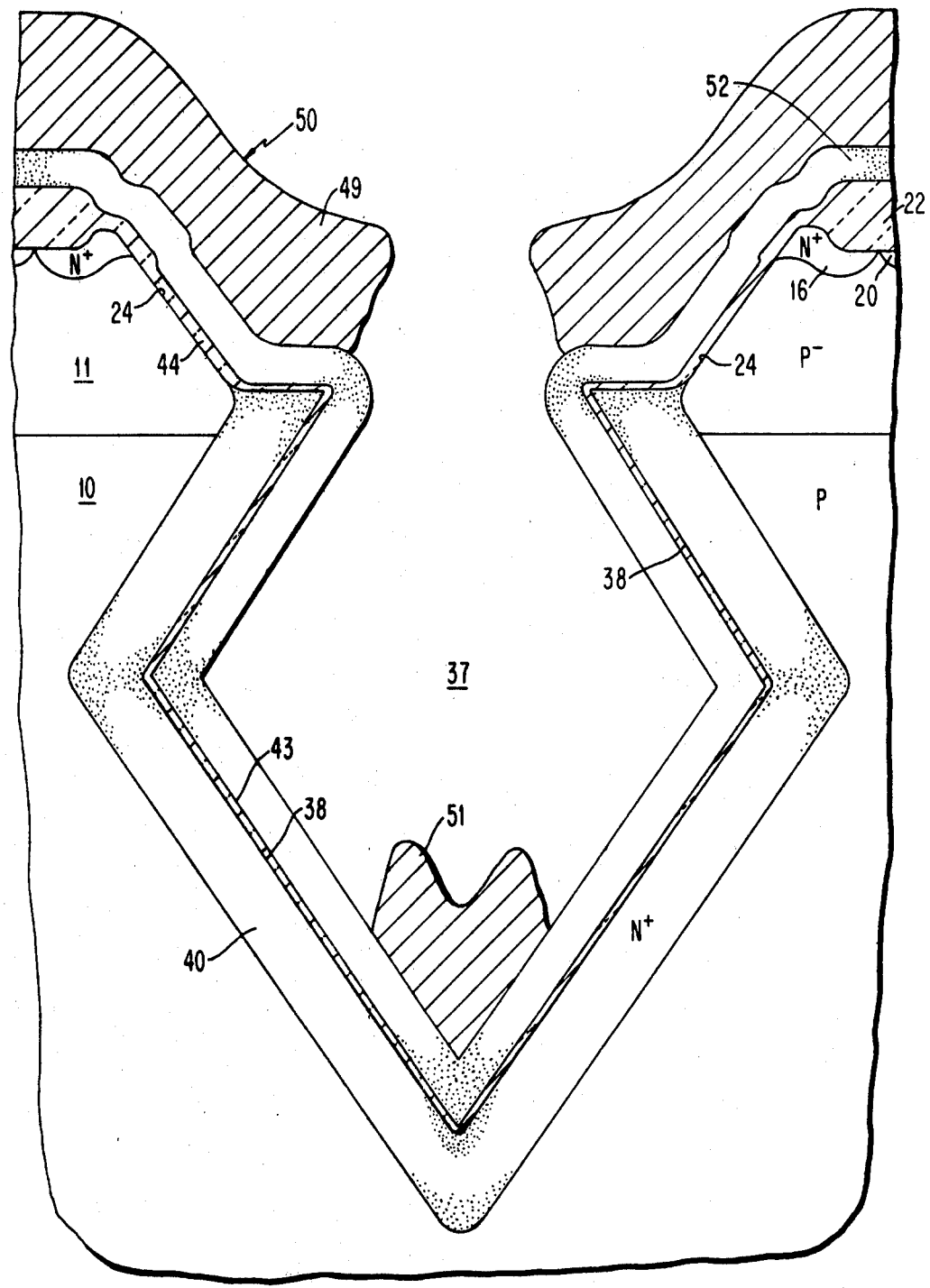
FIGS. 23 and 24 are fragmentary diagrammatic sectional views of a portion of the substrate showing various stages of formation of a modification of the dense vertical FET device.
Figure 24:
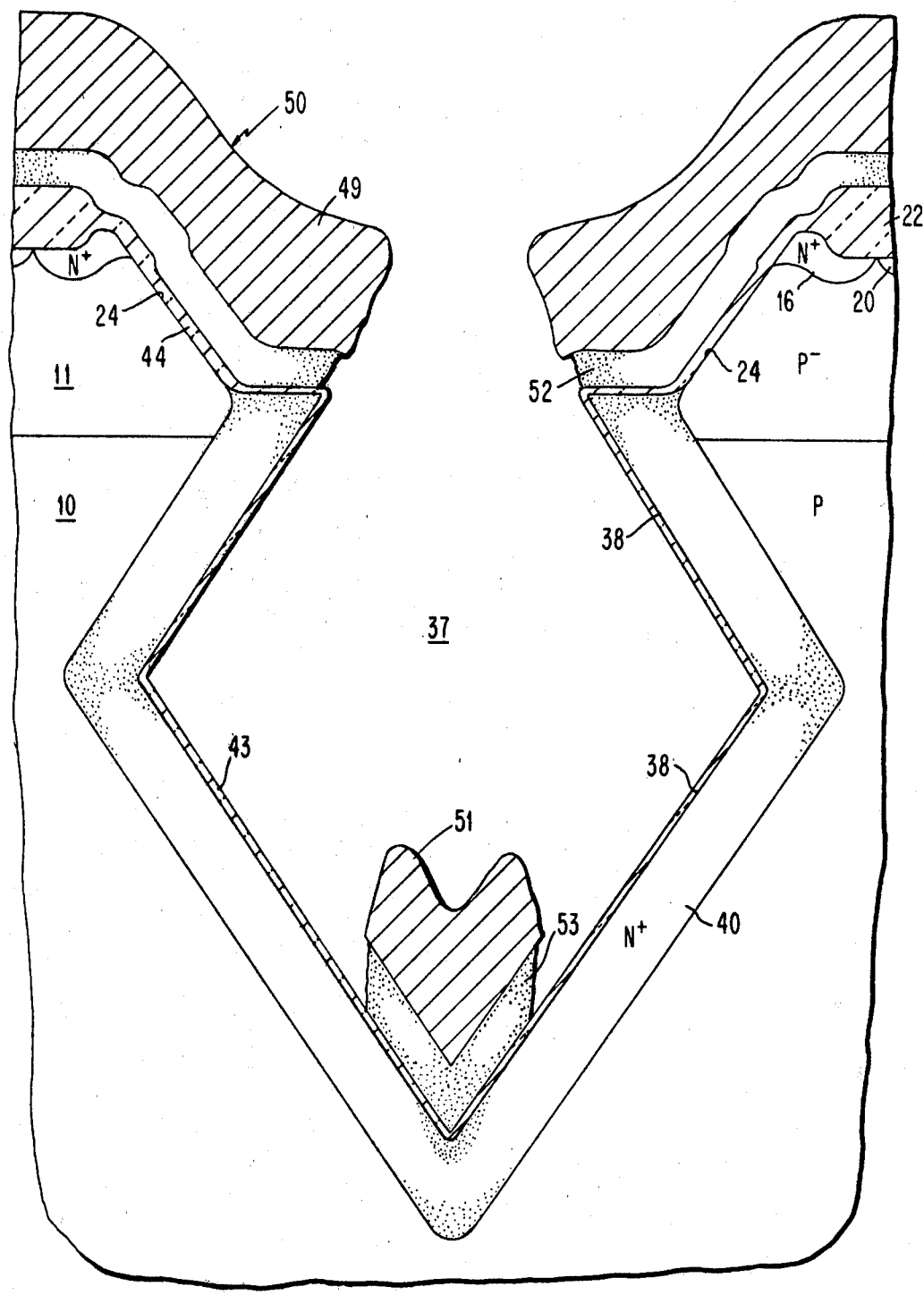

Referring to FIGS. 23 and 24, there is shown a modification of the invention in which a layer 52 of polycrystalline silicon is beneath the layer 49 of aluminum so that portions of the layer 52 of polycrystalline silicon function along with portions of the layer 49 of aluminum as the conductive lines 48 (see FIG. 21) and the word lines 50.

In this embodiment, the layer 52 (see FIGS. 23 and 24) of polycrystalline silicon is deposited by LPCVD after the contact holes 47 (see FIG. 22) have been formed in the ROX regions 22. All of the prior formation steps of this embodiment are the same as described with respect to FIGS. 1-22. The thickness of the layer 52 (see FIGS. 23 and 24) of polycrystalline silicon is in the range of 2,000 Å to 3,000 Å and preferably is 2,500 Å.

After the layer 52 of polycrystalline silicon is deposited, it is then doped by any suitable means to have the desired conductivity. For example, the substrate 10 may be placed in a furnace at 870° C. for twenty-five minutes. During the first ten minutes, only $N_2$ gas is used. For the next ten minutes, a gaseous mixture of $N_2$-$O_2$-$POCl_3$ is passed through the furnace. Finally, only $O_2$ gas flows through the furnace for five minutes. This produces a layer of phosphosilicate glass, which must then be stripped.

One suitable example of stripping the layer of phosphosilicate glass is through dip etching with a buffered hydrofluoric acid solution, which may be a 10:1 solution, for example. This solution etches the layer of phosphosilicate glass at a much faster rate than silicon.

After the layer of phosphosilicate glass has been stripped, the dopant is driven into the layer 52 of polycrystalline silicon by subjecting the substrate 10 to a temperature of 1,000° C. for fiteen minutes in an argon gas. This produces the desired level of doping of the layer 52 of polycrystalline silicon. The layer 52 of polycrystalline silicon is doped to have a sheet resistivity in the range of 25-40 ohms/square and preferably about 32 ohms/square.

Then, the layer 49 of aluminum is deposited as a blanket coating in the same manner as discussed with respect to FIG. 20. The layer 49 of aluminum is then etched in the manner previously described for forming the conductive lines 48 (see FIG. 21) and the word lines 50.

Then, the substrate 10 is annealed to cause the aluminum, which forms the conductive lines 48 and the word lines 50, to make good electrical contact to the portions of the layer 52 (see FIGS. 23 and 24) of polycrystalline silicon therebeneath. This annealing occurs at a temperature of 400° C. for thirty minutes in a forming gas of 95% nitrogen and 5% hydrogen.

With the remaining portions of the layer 49 of aluminum functioning as a mask, the layer 52 of polycrystalline silicon is etched by a pyrocatechol-ethylenediamine solution. This results in the remaining portions of the layer 52 of polycrystalline silicon being beneath remaining portions of the layer 49 of aluminum so that they cooperate together to form the conductive lines 48 (see FIG. 21) and the word lines 50.

The deposition of the layer 49 (see FIG. 23) of aluminum causes the portion 51 of aluminum to fall to the bottom of the recess 37. The portion 51 of aluminum rests on a portion 53 (see FIG. 24) of polycrystalline silicon after the layer 52 of polycrystalline silicon is etched. The portion 52 of polycrystalline silicon remains after etching because the portion 51 of aluminum functions as a mask during etching.

If desired, the portion of the layer 52 (see FIG. 23) of polycrystalline silicon within each of the recesses 37 may be etched by a pyrocatecol-ethylenediamine solution prior to any etching of the layer 49 of aluminum. This avoids any difficulty in exposing the layer of photoresist, which is used to etch the layer 49 of aluminum, within each of the recesses 37 as all of the photoresist must be removed to etch the portion of the layer 52 of polycrystalline silicon in each of the recesses 37.

In this method, a layer of aluminum is deposited as a blanket coating. This cannot be deposited in each of the recesses 37 other than at the bottom of each of the recesses 37 as occurs with the portion 51 of aluminum when the layer 49 of aluminum is deposited. Then, the layer 52 of polycrystalline silicon in each of the recesses 37 is etched with the layer of aluminum functioning as a mask for the portions of the layer 52 of polycrystalline silicon not in one of the recesses 37. After etching of the layer 52 of polycrystalline silicon, the mask layer of aluminum is completely stripped.

Then, a mask is put down by the well-known photoresist technique with openings being formed in the mask wherever the conductive lines 48 (see FIG. 21) and the word lines 50 are to be formed. Next, the layer 49 (see FIG. 23) of aluminum is deposited. Then, the mask is lifted off with the portions of the layer 49 of aluminum that are to be removed.

With the remaining portions of the layer 49 of aluminum, which form the portions of the conductive lines 48 (see FIG. 21) and the word lines 50, functioning as a mask, the layer 52 (see FIG. 23) of polycrystalline silicon is etched to form parts of the conductive lines 48 (see FIG. 21) and the word lines 50. Then, the substrate 10 is annealed in the same manner as previously described after etching of the layer 52 (see FIG. 23) of polycrystalline silicon is completed.

Figure 8:
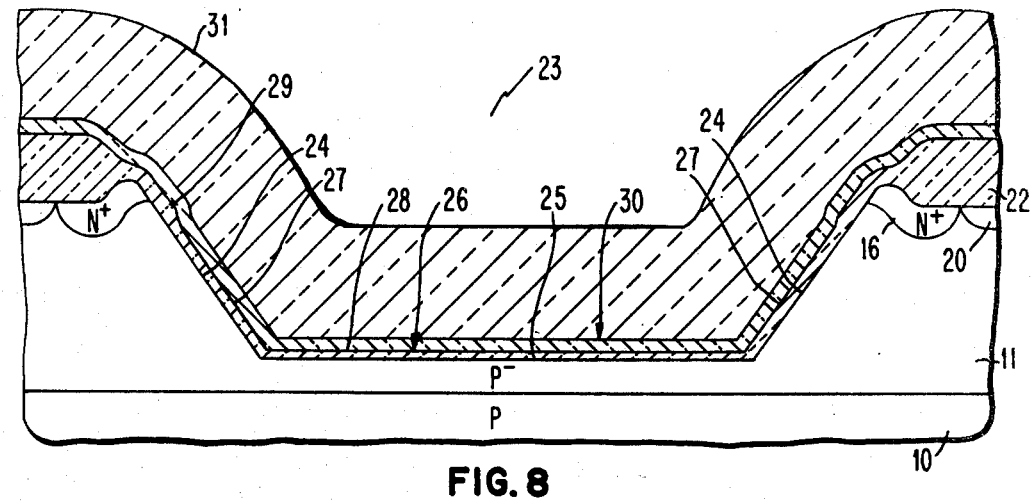
Figure 25:
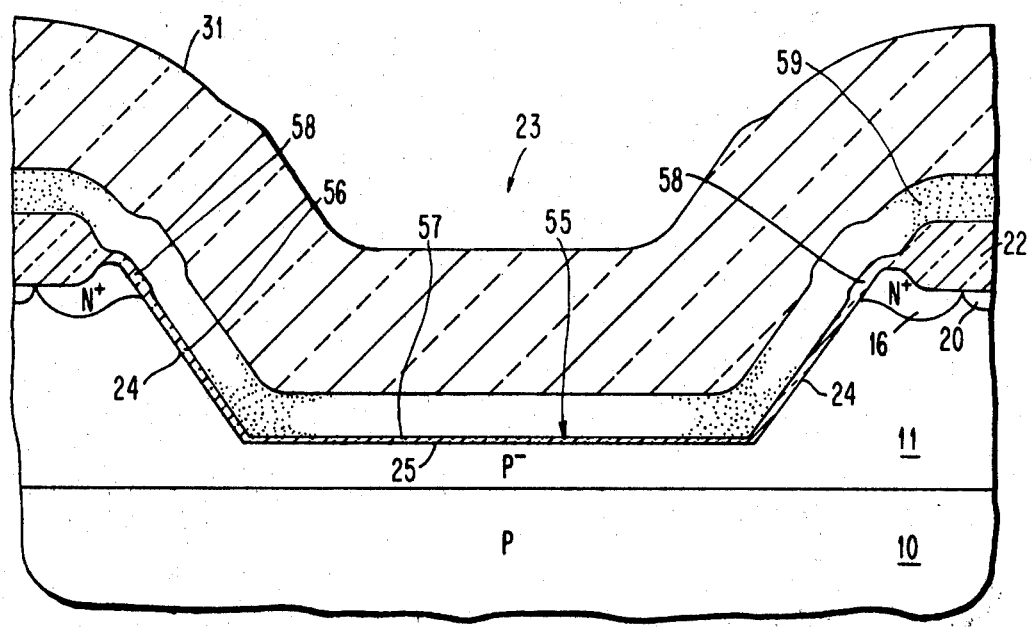
FIGS. 25 and 26 are fragmentary diagrammatic sectional views of a portion of the substrate showing various stages of formation of another modification of the dense vertical FET device.

Referring to FIG. 25, there is shown a stage of formation of the dense vertical FET replacing the stage of formation shown in FIG. 8. In this modification, a layer 55 of silicon dioxide is formed over the bottom wall 25 of the recess 23, the side walls 24 of the recess 23, and the portions of the top surface of the spaced portion of the N+ region 16 not covered by the ROX regions 22. The layer 55 of silicon dioxide is preferably thermally grown.

The thickness of portions 56 of the layer 55 of silicon dioxide along the side walls 24 of each of the recesses 23 below the spaced portion of the N+ region 16 is about 1.2 times the thickness of portion 57 of the layer 55 of silicon dioxide along the bottom wall 25 of each of the recesses 23. The thickness of portions 58 of the layer 55 of silicon dioxide on each of the side walls 24 along the spaced portion of the N+ region 16 is in a range of 1.4 to 2 times the thickness of the portion 57 of the layer 55 of silicon dioxide over the bottom wall 25 of each of the recesses 23. The thickness of the portion 56 of the layer 55 of silicon dioxide is preferably in the range of 225 Å to 500 Å.

The temperature at which the thermal oxidation occurs is selected to maximize this relationship of the thicknesses of various portions of the layer 55 of silicon dioxide. As the temperature increases, the thicknesses of the portions 56–58 of the layer 55 of silicon dioxide would tend to become more equal. Accordingly, when thermally growing the layer 55 of silicon dioxide in steam, the temperature is in the range of 800° C. to 925° C.

After the layer 55 of silicon dioxide is formed, a layer 59 of polycrystalline silicon is deposited by LPCVD as a blanket coating. The layer 59 of polycrystalline silicon must be doped at the time of deposition or it may be doped after deposition in the manner previously described for doping the layer 52 (see FIG. 23) of polycrystalline silicon. The layer 59 of polycrystalline has the same sheet resistivity as the layer 52 of polycrystalline silicon.

After the layer 59 of polycrystalline silicon is deposited, the layer 31 of silicon dioxide is deposited in the same manner as previously described with respect to FIG. 8. Thus, the layer 31 of silicon dioxide is preferably deposited by LPCVD with a thickness of one micron.

Then, the structure of FIG. 25 is subjected to the same steps of formation as shown and described with respect to FIGS. 9–18. After the layer 41 (see FIG. 18) of phosphosilicate glass is grown, the N+ region 40 is formed in the same manner as described with respect to FIG. 19. Likewise, in the same manner as described with respect to FIG. 19, the layer 41 (see FIG. 18) of phosphosilicate glass is stripped. As described with respect to FIG. 19, this stripping of the layer 41 (see FIG. 18) of phosphosilicate glass also etches the portion 32 of the layer 31 of silicon dioxide.

Because of the layer 59 (see FIG. 25) of polycrystalline silicon protecting the layer 55 of silicon dioxide, the necessity for removing the portion 56 of the layer 55 of silicon dioxide over the side walls 24 of each of the recesses 23 and the remaining portions 57 of the layer 55 of silicon dioxide is eliminated so that the layer 55 of silicon dioxide can function as the gate oxide. This is because the layer 55 of silicon dioxide does not have unbonded surface states thereon as occur when protecting the layer 26 (see FIG. 8) of silicon dioxide with the layer 30 of silicon nitride. Therefore, it is not necessary to either remove the layer 55 (see FIG. 25) of silicon dioxide or have the additional step of adding the layer 43 of silicon dioxide to serve as a gate oxide as described with respect to FIG. 19.

Accordingly, after the portions 32 (see FIG. 18) of the layer 31 of silicon dioxide have been removed during stripping of the layer 41 of phosphosilicate glass, it is only necessary to form the conductive lines 48 (see FIG. 21) and the word lines 50 through depositing the layer 49 (see FIG. 20) of aluminum as a blanket coating as described with respect to FIG. 20. The layer 49 of aluminum is etched to produce the conductive lines 48 (see FIG. 21) and the word lines 50. This may be accomplished in the manner described with respect to the stages of formation shown in FIGS. 23 and 24. This produces the structure shown in FIG. 26.

Figure 26:
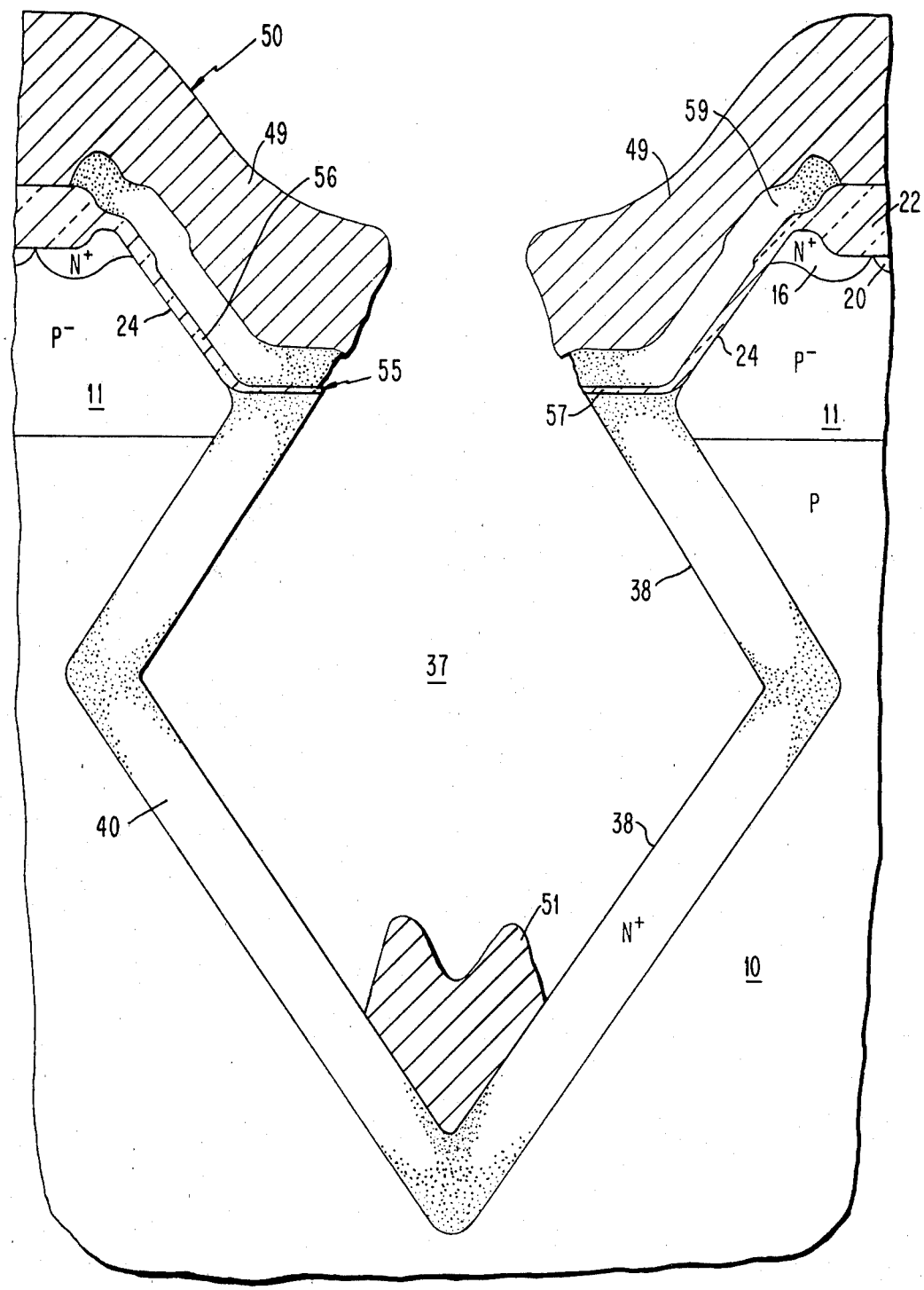

It should be understood that the layer 59 of polycrystalline silicon is removed from the upper surface of the substrate 10 during etching to form the recesses 37. Therefore, the conductive lines 48 (see FIG. 21) would not include any of the layer 59 of polycrystalline silicon as the layer 52 of polycrystalline silicon was included in the embodiment disclosed in FIGS. 23 and 24. Of course, the word lines 50 include both the remaining portions of the layer 59 of polycrystalline silicon over the portion 56 of silicon dioxide functioning as the gate oxide and the etched portions of the layer 49 of aluminum as shown in FIG. 26.

If desired, the layer 59 of polycrystalline silicon may be etched to form the word lines 50 before the layer 31 of silicon dioxide is deposited. In this embodiment, the well-known photoresist technique could be employed to produce a mask of photoresist over the portions of the layer 59 of polycrystalline silicon that are to be part of the word lines 50. Then, the layer 31 of silicon dioxide would be deposited in the manner previously described.

This structure would then be subjected to the same steps of formation as shown and described with respect to FIGS. 9–18. After the layer 41 (see FIG. 18) of phosphosilicate glass is grown, the N+ region 40 is formed in the same manner as was described with respect to FIG. 19.

However, the layer 41 (see FIG. 18) of phosphosilicate glass is not stripped so that the portion 32 of the layer 31 of silicon dioxide also is not etched since there is no stripping of the layer 41 of phosphosilicate glass. As discussed with respect to the structure of FIGS. 25 and 26, it is not necessary to remove the portion 56 of the layer 55 of silicon dioxide over the side walls 24 of each of the recesses 23 because of it being protected by the layer 59 of polycrystalline silicon during etching to form the recesses 37. Therefore, it also is not necessary to remove the portion 32 of the layer 31 of silicon dioxide. The portion 56 of the layer 55 of silicon dioxide functions as the gate oxide.

Figure 27:
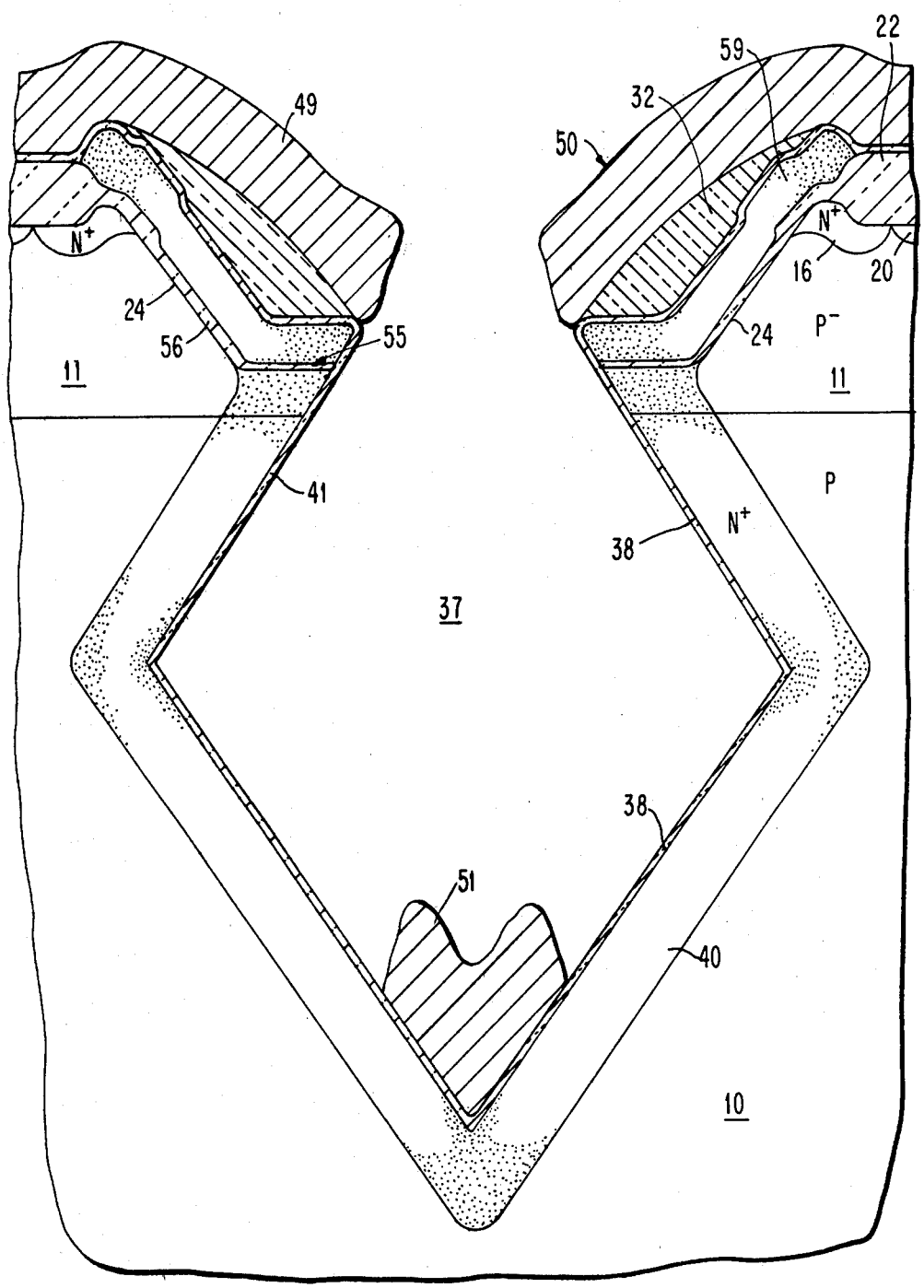
FIG. 27 is a fragmentary diagrammatic sectional view of a portion of the substrate showing a stage of formation of a further modification of the dense vertical FET device.

After the N+ region 40 (see FIG. 19) has been produced, it is only necessary to form the conductive lines 48 (see FIG. 20) and the metal portions of the word lines 50 through depositing the layer 49 of aluminum as a blanket coating as described with respect to FIG. 20. The layer 49 of aluminum is etched to produce the conductive lines 48 and the metal portions of the word lines 50. This may be accomplished in the manner described with respect to the stages of formation shown in FIGS. 23 and 24. This produces the structure shown in FIG. 27.

While the conductive lines 48 and the word lines 50 have been shown and described as including at least aluminum, it should be understood that any other suitable conductive material may be employed. This could include metal silicides, for example.

While the substrate 10 has been described as having the epitaxial layer 11, it should be understood that the epitaxial layer 11 is optional. Therefore, the present invention does not require the epitaxial layer 11 although it is preferred.

An advantage of this invention is that it does not require a buried storage node to have increased density as in a VMOS memory cell. Another advantage of this invention is that it eliminates the point break down problem of the VMOS memory cell. A further advantage of this invention is that it does not require outdiffusion for control of the threshold voltage of the FET device. Still another advantage of this invention is that it has an increased charge transfer efficiency in comparison with VMOS memory cells when it has a comparable density with the VMOS memory cells.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of forming a dense vertical FET device including:

providing a dielectrically isolated region in a substrate of monocrystalline silicon;

forming a first region of opposite conductivity to the conductivity of the substrate in a surface of the dielectrically isolated region to function as one of drain and source regions of the FET;

anisotropically chemical etching through the first region of opposite conductivity and into the substrate to a selected depth to produce a first recess surrounded at its upper end by the first region of opposite conductivity and having converging walls and a substantially flat bottom wall with the length of each of the converging walls in the substrate beneath the first region of opposite conductivity being the desired length of a gate channel of the FET;

forming a first layer of silicon dioxide over the converging walls and the bottom wall of the first recess in the substrate;

forming a second layer of a material selected from the group consisting of silicon nitride and polycrystalline silicon over the layer of silicon dioxide;

forming a third layer of silicon dioxide over the second layer of material;

removing each of the first layer, the second layer, and the third layer from at least a portion of the bottom wall of the first recess to expose at least the portion of the bottom wall of the first recess while leaving each of the first layer, the second layer, and the third layer on at least the converging walls of the first recess;

etching an enlarged recess in the substrate through the exposed portion of the bottom wall of the first recess not protected by the first layer, the second layer, and the third layer;

diffusing an impurity of opposite conductivity to the conductivity of the substrate into the walls of the enlarged recess to form a second region of opposite conductivity to the conductivity of the substrate to function as the other of the source and drain regions of the FET and a plate of a storage capacitor;

removing each of the first layer, the second layer, and the third layer from the converging walls of the first recess after the second region of opposite conductivity is formed only when the second layer is silicon nitride;

providing a gate oxide for the gate channel of a layer of silicon dioxide by forming a layer of silicon dioxide over the converging walls of the first recess after removal of the first layer, the second layer, and the third layer when the second layer is silicon nitride and by using the first layer of silicon dioxide when the second layer is polycrystalline silicon;

and forming electrical contacts to each of the first region of opposite conductivity and the gate channel.

2. The method according to claim 1 including etching the enlarged recess in the substrate through the exposed portion of the bottom wall of the first recess not protected by the first layer, the second layer, and the third layer by:

etching a trench having two pairs of substantially parallel side walls into the substrate;

and etching the two pairs of substantially parallel side walls of the trench to form the enlarged recess with its side walls diverging from the upper end of the trench and its side walls converging at their lower ends.

3. The method according to claim 2 including:

forming an epitaxial layer on the substrate;

forming the first region in a surface of the epitaxial layer;

and forming the first recess only in the epitaxial layer.

4. The method according to claim 1 including etching the enlarged recess in the substrate through the exposed portion of the bottom wall of the first recess not protected by the first layer, the second layer, and the third layer by:

reactive ion etching a trench having two pairs of substantially parallel side walls into the substrate;

and chemically etching the two pairs of substantially parallel side walls of the trench to form the enlarged recess with its side walls diverging from the upper end of the trench and its side walls converging at their lower ends.

5. The method according to claim 4 including:

forming an epitaxial layer on the substrate;

forming the first region in a surface of the epitaxial layer;

and forming the first recess only in the epitaxial layer.

6. The method accoding to claim 1 including etching the enlarged recess in the substrate through the exposed portion of the bottom wall of the first recess not protected by the first layer, the second layer, and the third layer by:

etching a trench having two pairs of substantially parallel side walls into the substrate;

and etching the two pairs of substantially parallel side walls of the trench to form the enlarged recess with each pair of its side walls diverging from the upper end of the trench and then converging from the diverging ends of the side walls with at least one pair of the converging side walls engaging each other at their lower ends.

7. The method according to claim 6 including:
forming an epitaxial layer on the substrate;
forming the first region in a surface of the epitaxial layer;
and forming the first recess only in the epitaxial layer.

8. The method according to claim 1 including etching the enlarged recess in the substrate through the exposed portion of the bottom wall of the first recess not protected by the first layer, the second layer, and the third layer by:
reactive ion etching a trench having two pairs of substantially parallel side walls into the substrate;
and chemically etching the two pairs of substantially parallel side walls of the trench to form the enlarged recess with each pair of its side walls diverging from the upper end of the trench and then coverging from the diverging ends of the side walls with at least one pair of the converging walls engaging each other at their lower ends.

9. The method according to claim 8 including:
forming an epitaxial layer on the substrate;
forming the first region in a surface of the epitaxial layer;
and forming the first recess only in the epitaxial layer.

* * * * *